United States Patent [19]

Takebuchi

[11] Patent Number: 5,101,248
[45] Date of Patent: Mar. 31, 1992

[54] SEMICONDUCTOR DEVICE
[75] Inventor: Masataka Takebuchi, Yokohama, Japan
[73] Assignee: Kabushiki Kaisha Toshiba, Kawasaki, Japan
[21] Appl. No.: 658,699
[22] Filed: Feb. 21, 1991
[30] Foreign Application Priority Data Feb. 23, 1990 [JP] Japan ..................... 2-42888

[51] Int. Cl.$^5$ ............................................. H01L 29/68
[52] U.S. Cl. .................................... 357/23.5; 357/23.8;
357/41; 357/46; 357/54; 357/55
[58] Field of Search ............. 357/23.5, 23.8, 41, 357/46, 54, 55

[56]  References Cited

U.S. PATENT DOCUMENTS 4,988,635  1/1991  Ajika et al. ..................... 357/23.5
5,008,721  4/1991  Gill et al. ........................ 357/23.5

FOREIGN PATENT DOCUMENTS 58-197776  11/1983  Japan .
59-16371    1/1984  Japan .
60-226181  11/1985  Japan .

Primary Examiner—Edward J. Wojciechowicz
Attorney, Agent, or Firm—Finnegan, Henderson, Farabow, Garrett, and Dunner

[57]  ABSTRACT

An electrically erasable and programmable non-volatile semiconductor having a selection transistor, a memory transistor, and a logic transistor. The selection transistor has a first gate insulating film of a first film thickness and is made operative by a gate voltage of about 20V. The memory transistor has a second gate insulating film comprising a first portion whose film thickness is the same as the first film thickness and a second portion of a second film thickness smaller than the first film thickness. The memory transistor also has an electrically floating gate arranged on the second gate insulating film. The logic transistor has a third gate insulating film of a third film thickness smaller than the first film thickness but larger than the second film thickness and is made operative by a gate voltage of about 5V. When the second film thickness is represented by A, the third film thickness by B, and the first film thickness by C, A:B:C=1:2.1:4.2.

4 Claims, 4 Drawing Sheets

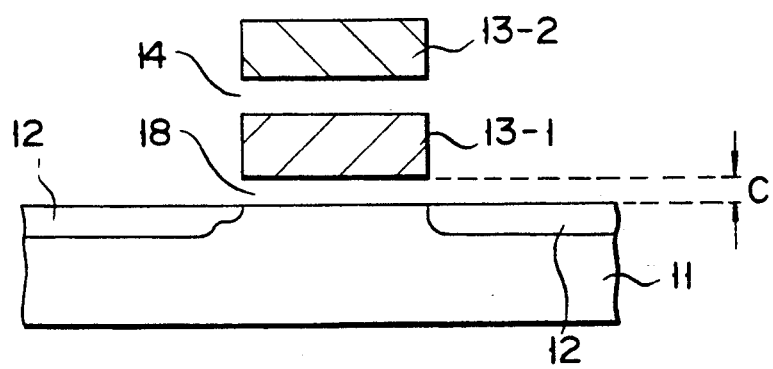
F I G. 2A
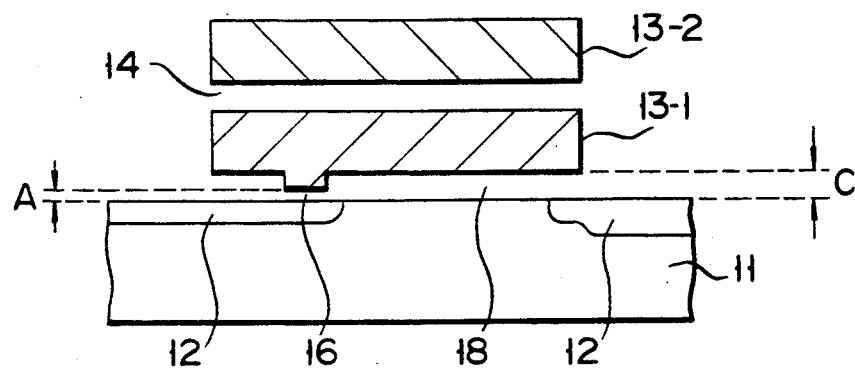
F I G. 2B
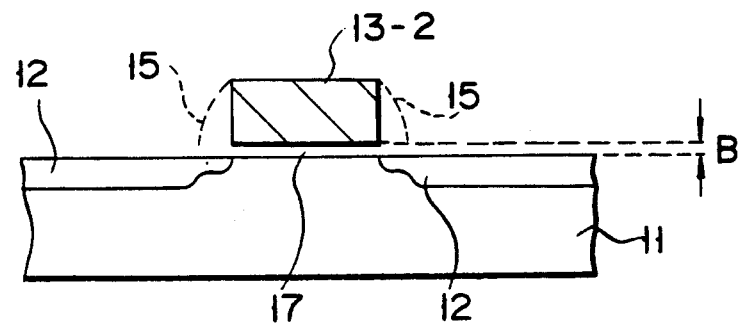
F I G. 2C

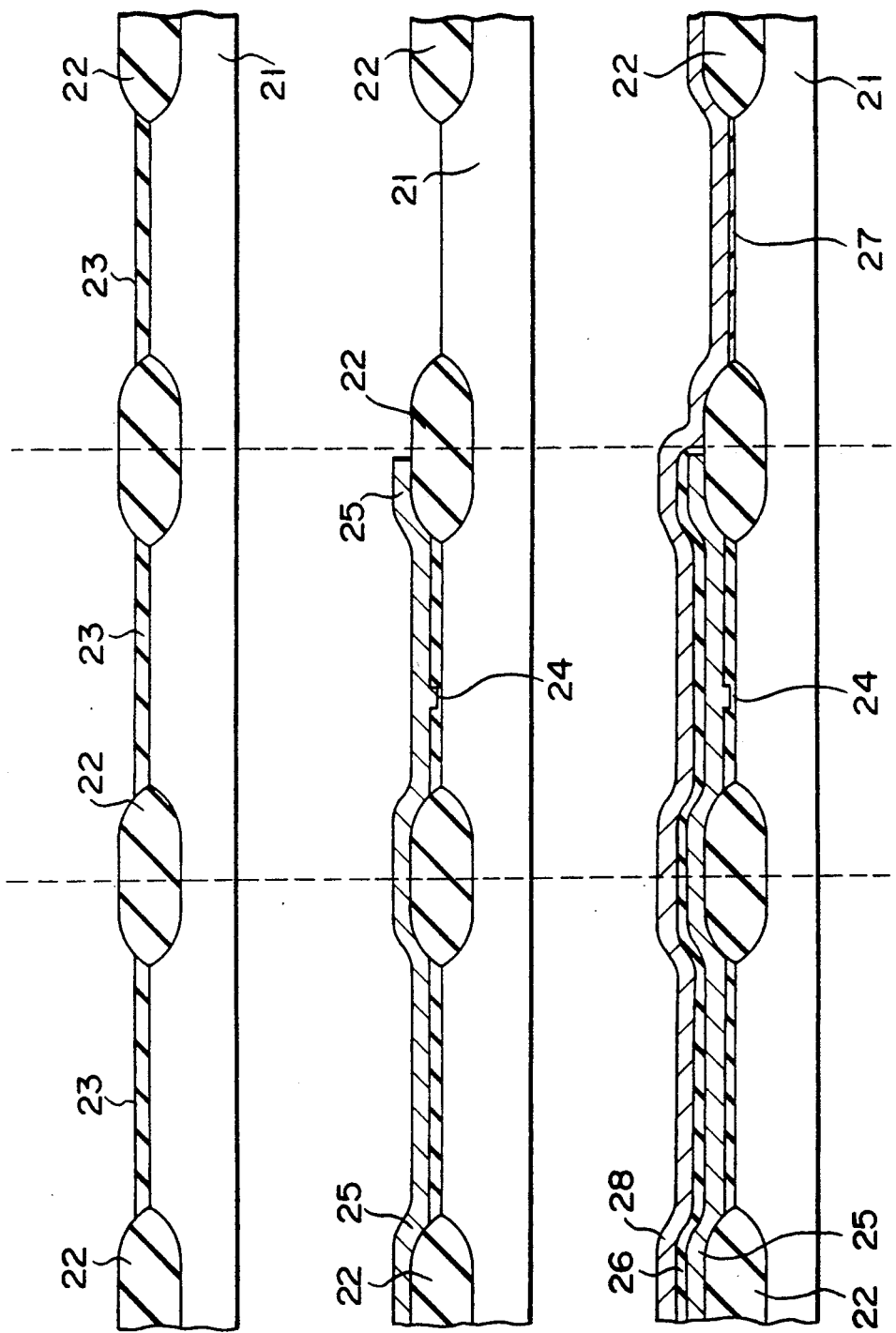

SEMICONDUCTOR DEVICE

BACKGROUND OF THE INVENTION

1. Field of the Invention

The present invention relates to a semiconductor device and, more particularly, it relates to an electrically erasable and programmable non-volatile semiconductor device.

2. Description of the Related Art

Electrically erasable and programmable ROMs (EEPROM) are well known as an electrically erasable and programmable non-volatile memory. The EEPROM, similar to the EPROM, stores information responsive to charges stored in the memory cell and uses the tunnel phenomenon to transfer charges in its programming and erasing processes wherein electrons are sent to and received by a floating gate using a tunnel current which passes through a thin tunnel insulating film on the substrate of the device.

FIG. 1A is a pattern plan showing an arrangement of one cell of a conventional EEPROM, FIG. 1B is a sectional view taken along a line IB—IB in FIG. 1A, FIG. 1C is a sectional view taken along a line IC—IC in FIG. 1A, and FIG. 1D is a sectional view showing a logic transistor which is a component formed on the same substrate as that of the memory cell to form a large-scale logic circuit, such as a gate array.

In FIGS. 1A through 1D, the cell which represents 1 bit (unit of information) comprises a selection transistor 41 for preventing half-selection and a memory transistor 42 for storing information. Namely, a selection gate 46 and a floating gate 47 are formed, adjacent to each other and with a gates insulating film 45 interposed between a semiconductor substrate 43 and them, at an element region separated from each other on the substrate 43 by elements separating regions 44, a control gate 49 is also formed there with an interlayer insulating film 48 interposed between the floating gate 47 and control gate 49. Reference numeral 50 denotes a diffusion layer which has a conductivity type opposite that of the substrate, and reference numeral 51 is an aluminium wiring formed on the interlayer insulating film.

Information is stored in the electrically floating gate 47 of the memory transistor 42. The memory transistor is on- and off-controlled responsive to electrons stored in and missed in the floating gate 47. The region of a tunnel insulating film 52 which corresponds to a thinner part (about 100Å, for example) of the gates insulating film 45 is used to store and miss electrons in the floating gate 47. Namely, tunnel current flows through the tunnel insulating film 52 due to bias added between the control gate 49 and the diffusion layer 50. Electrons are thus sent to and received by the floating gate 47.

In the case of the logic transistor which serves to form the large-scale logic circuit and which is shown in FIG. 1D, a gate electrode 53 is formed on the same substrate 43 with the gates insulating film 45 interposed between the substrate and the electrode, and the diffusion region which has a conductivity opposite that of the substrate is formed separating from the gate electrode 53.

An electric current needed to write and erase information in and from the cell may be small in the case of the EEPROM which uses the tunnel phenomenon. Most of the EEPROMs include a boosting circuit (not shown) to create high voltage in the elements, and they are made operative by a single power source (about 5V, for example).

In the case of the above-described conventional example, high voltage (about 20V) is added from the boosting circuit to the memory cell and the gate electrode of the selection transistor shown in FIGS. 1A through 1C and common power source voltage (about 5V) is added to the gate electrode of the logic transistor shown in FIG. 1D.

In spite of the fact that these voltages are used, however, the gates insulating film has the same film thickness (h) (about 450Å, for example) except in the region of the tunnel insulating film 52. In short, the gates insulating film used by the conventional EEPROMs is formed to have a film thickness of about 450Å in all of the transistors of the high voltage and 5V types except at the tunnel insulating film whose film thickness is about 100Å.

When arranged in this manner, the logic transistor has a film thickness of 450Å which is the same as that of the high voltage gates insulating film, although its operation voltage is 5V supplied from the common power source. This causes the following problems:

Firstly, operation speed becomes low.

Current $I_{DS}$ between the drain and the source is usually calculated to assume the operation speed of a single transistor. As this $I_{DS}$ becomes larger, the operation speed becomes higher. The $I_{DS}$ can be expressed as follows at the saturated region of the transistor usually used:

$$I_{DS} = \frac{1}{2} \mu \, C_{OX} \frac{W}{L} (V_{GS} - V_{TH})^2 \qquad (1)$$

wherein $C_{OX} = \epsilon_0 \epsilon_I S / d_I$, and wherein $\mu$ represents the mobility in channel, $C_{OX}$ the capacity of gates insulating film, W the width of channel, L the length of channel, $V_{GS}$ voltage between the drain and the source, $V_{TH}$ the threshold value, $d_I$ the film thickness of insulating film, $\epsilon_0$ the dielectric constant in vacuum, $\epsilon_I$ the relative dielectric constant of insulating film, and S the area of electrode.

According to the above equation (1), $I_{DS}$ is decreased as the film thickness $d_I$ of insulating film becomes larger. As the gates insulating film becomes thicker, therefore, the operation speed of the transistor becomes lower.

Secondly, there is the problem of short channel effect which has become a new obstacle in the course of integrating the circuit as much as possible. The approximate equation of this short channel effect can be expressed as follows:

$$\Delta V_{TH} = \frac{(4\epsilon_S \, q N_A \, \psi_B)^{\frac{1}{2}}}{C_I} \times \frac{\Delta L}{L_{eff}} \qquad (2)$$

wherein $C_I = \epsilon_0 \, \epsilon_I \, S / d_I$ and $L = [(Xj + Wj)^2 - Wc^2]^{\frac{1}{2}} - Xj$ and wherein $\Delta V_{TH}$ denotes the changed part of $V_{TH}$ caused by the short channel effect, $\epsilon_S$ the relative dielectric constant of silicon, q the amount of charge, $N_A$ the density of acceptor impurity, $\psi S$ the surface potential, $C_I$ the capacity of insulating film, Leff the effective length of channel, Xj the depth of junction, Wj the width of junction depletion layer, and Wc the width of channel depletion layer.

According to the above equation (2), $V_{TH}$ becomes larger and the short channel effect becomes higher as the film thickness of the insulating film becomes larger.

This prevents the circuit from being integrated as much as possible.

In the case of the conventional EEPROMs, the gates insulating film of each of transistors is formed to have the same film thickness except the region of the tunnel insulating film without taking voltages used into consideration.

This prevents the operation speed of the circuit located in the periphery of the memory cell and that of the large-scale logic circuit, both of them being made operative by the power source voltage, from being made higher. This also prevents the circuits from being integrated as much as possible because the short channel effect becomes high.

SUMMARY OF THE INVENTION

The present invention is intended to eliminate the above-mentioned drawbacks and the object of the present invention is therefore to provide a semiconductor device enabling logic transistors to be more highly enhanced in their capability and to be more highly integrated, wherein the logic transistors form a circuit located in the periphery of a memory cell and a large-scale logic circuit which are made operative by voltage supplied from the common power source.

A semiconductor device according to the present invention comprises a first MOS transistor provided with a first gates insulating film which has a first film thickness; a second MOS transistor provided with a second insulating film, said second insulating film including a first portion whose film thickness is the same as the first film thickness and a second portion which has a second film thickness smaller than the first film thickness; and a third MOS transistor provided with a third insulating film which has a third film thickness smaller than the first film thickness The first MOS transistor is made operative by a first gate voltage and the third MOS transistor is made operative by a second gate voltage lower than the first gate voltage. The third film thickness is preferably made larger than the second film thickness, and when the second film thickness is represented by A, the third film thickness by B and the first film thickness by C, A : B : C = 1×(1±0.25) : 2.1×(1 ±0.25) : 4.2×(1 ±0.25).

In the case where the semiconductor device is of the electrically erasable and programmable non-volatile type, the second MOS transistor is of the memory type having an electrically floating gate arranged on the second gates insulating film, the first MOS transistor is of the selection type for the memory transistor, and the third MOS transistor is of the logic type which is component for forming the large-scale logic circuit.

According to the present invention, the film thickness of the gates insulating film of the logic transistor which is a component for forming a circuit located in the periphery of the EEPROM or a large-scale logic circuit formed in a mixture on the same semiconductor substrate as the EEPROM is, both of these circuits being made operative by 5V, for example, is made smaller than that of the gates insulating film of each of cells and transistors to which high voltage is added to achieve programming and erasing processes. As a result, drain current is increased by new transistors formed by the gates insulating films, and the operation speed of each of the circuits can be thus enhanced. In addition, that part of threshold value which is changed by the short channel effect can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A through 2C are sectional views showing arrangements of transistors forming an example of the EEPROM according to the present invention;

FIGS. 3A through 3C are sectional views showing the process of forming each of the transistors shown in FIGS. 2A through 2C to make an example of the EEPROM according to the present invention.

DETAILED DESCRIPTION OF THE PREFERRED EMBODIMENTS

Figure 1A:
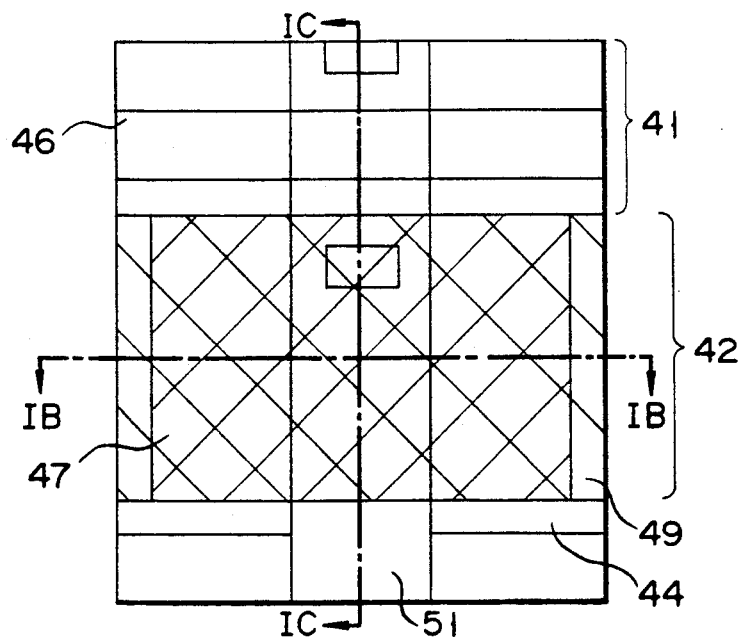
FIG. 1A is a pattern plan showing an arrangement of one memory cell of a conventional EEPROM.
Figure 1B:
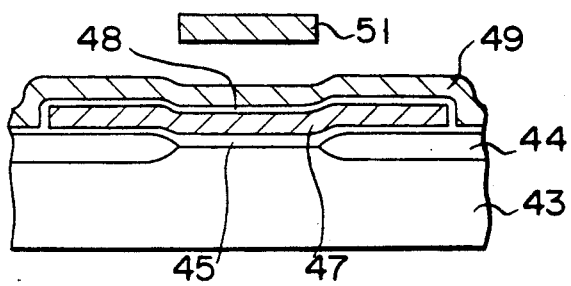
FIG. 1B is a sectional view taken along a line 1B—1B in FIG. 1A.
Figure 1C:
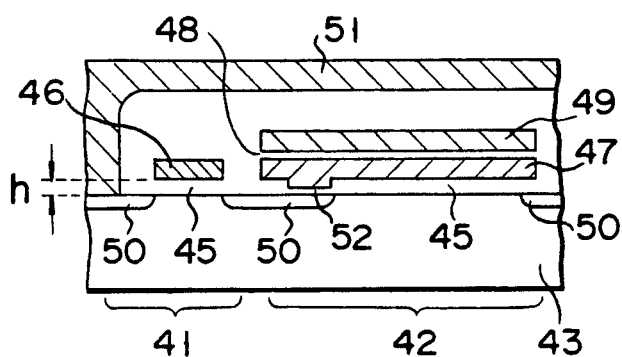
FIG. 1C is a sectional view taken along a line 1C—1C in FIG. 1A.
Figure 1D:
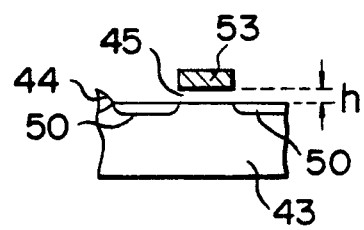
FIG. 1D is a sectional view showing a transistor of the logic system formed on the same substrate as that of the memory cell to form a large-scale logic circuit.

The present invention will be described citing some embodiments thereof with reference to the accompanying drawings.

FIGS. 2A through 2C are sectional views showing arrangements of transistors forming an example of the EEPROM according to the present invention, in which FIG. 2A is a sectional view showing the transistor arrangement of the high voltage type located at the peripheral region of the memory cell which is made operative by boosted high voltage (20V). FIG. 2B is a sectional view showing the arrangement of the memory cell transistor. FIG. 2C is a sectional view showing the arrangement of one channel transistor of CMOS transistors of a logic system for forming memory cell peripheral and large-scale logic circuits which are made operative by common power voltage (5V).

Transistors shown in FIGS. 2A through 2C are mounted in a mixture on the same semiconductor substrate 11. As well known, a diffusion region 12 whose conductivity is opposite to that of the substrate is formed in the substrate. A gate insulating film 18 is formed between the substrate and the gate electrode 13-1 and an interlayer insulating film 14 is formed between the gate electrode 13-1 and a gate electrode 13-2. Broken lines 15 in FIG. 2C show gate side wall sections for forming the lightly doped drain (LDD) structure.

According to the present invention, gate insulating films used for the EEPROM include a tunnel insulating film 16 in the memory cell, an insulating film 17 of 5V type in the transistor of the logic type, and an insulating film 18 of the high voltage type in the memory cell and transistor of the high voltage type and each of these insulating films has a film thickness different from those of the others.

The gate insulating film in the transistor of the logic type shown in FIG. 2C and made operative by common power source voltage (5V) is formed as the insulating film 17 of 5V type whose film thickness is made smaller than that of the insulating film 18 of the high voltage type.

In this example, the insulating film 18 of the high voltage type has a film thickness of about 450Å and the insulating film 17 of 5V type has a film thickness of about 250Å. This allows the 5V transistor of the logic type to be made higher in speed and the short channel effect to be suppressed. Further, the capacity of the transistor to be integrated can be increased.

Concerning the relationship that exists with the film, the following is provided thicknesses of these three insulating films.

The tunnel insulating film 16 which needs a high electric field for charge transfer is the thinnest.

The film thickness of the tunnel insulating film 16 is often determined by the capacitive coupling rate which represents the coupling rate of the memory transistors The capacitive coupling rate is a parameter representing whether writing is easy or difficult at the time when a charge is received by the floating gate. When this rate is large, the writing is easy.

As the film thickness of the tunnel insulating film 16 increases, writing becomes more difficult and as the thickness decreases, writing becomes easier. When the film thickness becomes too small, however, the charge holding characteristic, which is most important to provide the EEPROM with high reliability worsens. The upper and the lower limits of the film thickness are thus severely restricted. The film thickness A (shown in FIG. 2B) of the tunnel insulating film 16 must be about 100Å from this point of view.

The insulating film 18 of the high voltage type to which voltage of 20V is added will be now described.

The insulating film 18 usually has a film thickness of about 450Å. Electric field added to the insulating film 18 is about 4.4MV/cm. If it is a concern that this film thickness of about 450Å is large enough for the electric field added, the thickness may be increased to some extent. Thus, it may be requested that the film thickness C (shown in FIG. 2A) of the high voltage insulating film 18 is larger than 450Å.

The 5V insulating film 17 which is used under the power source voltage of 5V will be now described.

As mentioned above, the film thickness B (shown in FIG. 2C) of the insulating film 17 is about 250Å. It is not limited particularly to 250Å, but as the thickness increases, the operation speed is made lower and change and irregularity in threshold value become more remarkable because of short channel effect. As the thickness becomes smaller, effects reverse to the above can be expected. The lower limit of it is determined by electric field added to the insulating film 17, but the film thickness can be about 120Å.

As described above, the gate insulating films used for the EEPROM are generally grouped into three including the tunnel insulating film 16, the 5V insulating film 18, and the high voltage insulating film 18, which are different in film thickness from one another. Providing that the film thickness of the tunnel insulating film is represented by A, the film thickness of the 5V insulating film by B, and the film thickness of the high voltage insulating film by C, $$A < B < C \tag{3}$$

$A < B$ in the above relation is an essential term because the range of film thicknesses which the tunnel insulating film 16 is allowed to have is quite narrow in order to allow the tunnel insulating film 16 to have such characteristics as described above and the tunnel insulating film 16 cannot be made as thick as desired and because the lower limit value of the 5V insulating film 17 which is determined by electric field added must be 120Å (4.2MV/cm), considering the number of defective transistors produced in the course of the manufacturing process and the reliability of transistors produced as complete ones.

$B < C$ in the above relation is also a necessary term in the present invention. This term is needed to eliminate the above-mentioned drawbacks, make the operation speed higher, and enable the capability of elements to be sufficiently attained.

When the scaling of these insulating films is considered at the time of designing them, their ratio is as follows:

$$A : B : C = 1 : 2.1 : 4.2 \tag{4}$$

wherein each of film thicknesses A, B and C has an allowable range of ±25% relative to its value shown on the right side of the equal mark.

When the film thickness A of the tunnel insulating film 16 is 80Å, for example, equation (2) provides that the film thickness B of the 5V insulating film 17 is 168±41Å and that the film thickness C of the high voltage insulating film 18 is 336±82Å. When the film thickness A is set to be 80Å, therefore, the boosted voltage which has conventionally been 20V can be reduced to about 17V. In this case, however, the interlayer insulating film 14 must be made thicker at the same time.

It is quite important that the film thickness of each of the insulating films is designed to enable each of the transistors thus produced to attain its maximum capability and that the ratio of these film thicknesses is defined, as described above, considering the scaling of these insulating films.

FIGS. 3A through 3C are sectional views showing the process of making each of the transistors shown in FIG. 2A through 2C to provide an example of the semiconductor device according to the present invention. A region of the high voltage type which forms the high voltage transistor, a memory cell region which forms the memory cell transistor, and a region of the 5V type which forms the logic transistor are present from left to right in FIGS. 3A through 3C, and they are formed in a mixture on the same substrate. In FIGS. 3A through 3C, the interlayer insulating film between the floating and the control gate is a single layer.

After an elements separating insulation film 22 is formed on a semiconductor substrate 21, the substrate 21 is thermal-oxidized to form a gates insulating film 23 of the high voltage type which has a desired film thickness (FIG. 3A).

Only a tunnel window portion at the memory cell region is bored, using the photolithographic technique, until the substrate 21 is exposed. A tunnel insulating film 24 is formed by thermal oxidization and a first conductive film 25 is then formed by low pressure chemical vapor deposition (LPCVD) method. After thermal treatment, those portions of the first conductive film 25 and the gates insulating film 23 which extend over the 5V region are etching-removed, using photolithography again, and that top of the substrate 21 which corresponds to an element active portion at the 5V region is exposed (FIG. 3B).

An interlayer insulating film 26 at both of the memory cell and high voltage regions and a gates insulating film 27 at the 5V region are formed at the same time. The gates insulating film 27 has a film thickness only half that of the interlayer insulating film 26 on the first conductive film (polysilicon) because it is developed from the substrate. The gates insulating film 27 is formed in this manner to have a desired film thickness and a second conductive film 28 is then formed and thermal-treated (FIG. 3C).

The first conductive film becomes a floating gate and the second conductive film becomes a control gate at the memory region. In the high voltage transistor the first and the second conductive film are short-circuited with each other through a metal wiring or the second conductive film is removed.

Figures 4A, 4B, 4C:
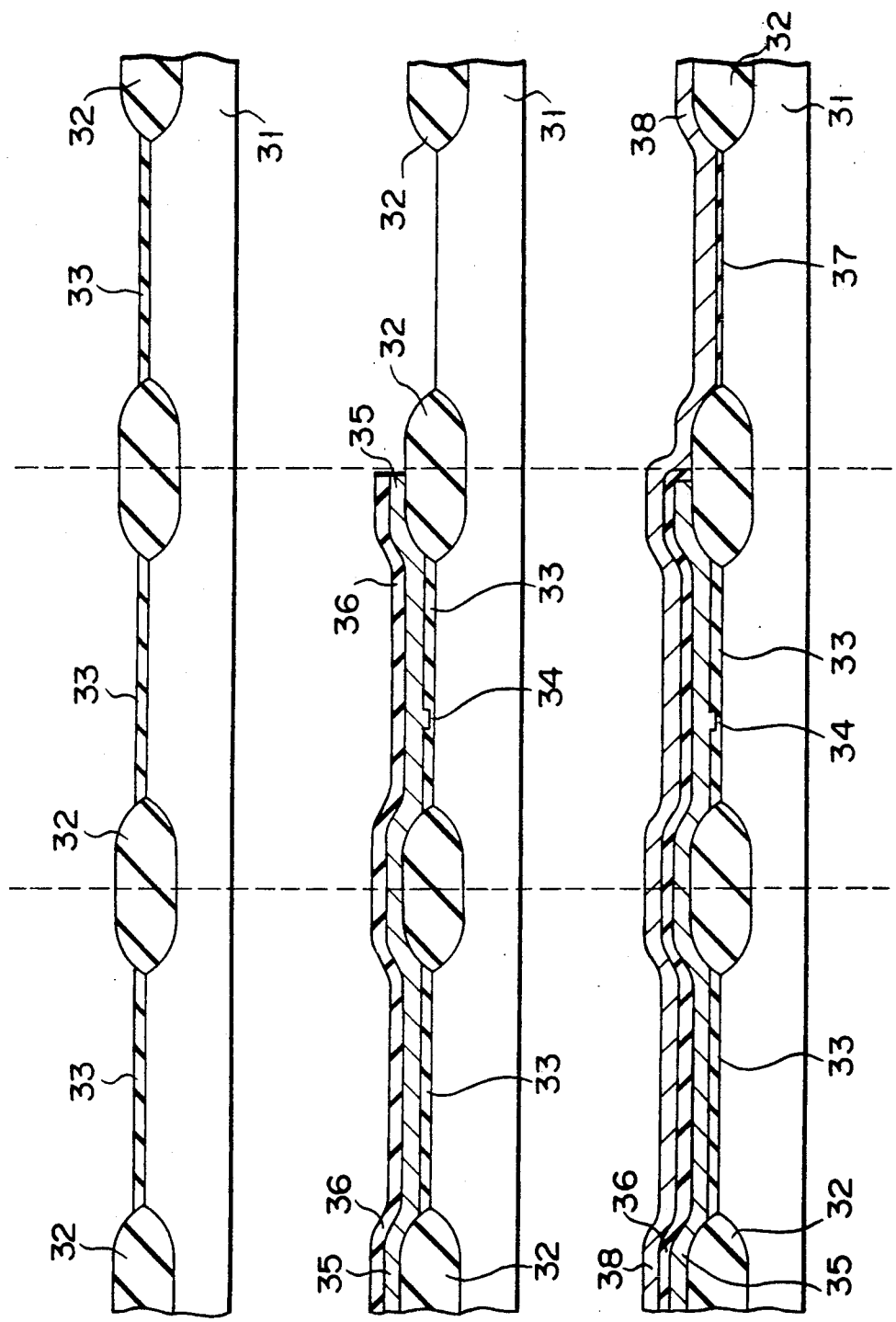
FIGS. 4A through 4C are sectional views showing the process of forming each of the transistors shown in FIGS. 2A through 2C to make another example of the EEPROM according to the present invention.

FIGS. 4A through 4C are sectional views showing the process of making each of the transistors shown in FIGS. 2A through 2C to provide another example of the semiconductor device according to the present invention. In FIGS. 4A through 4C, the interlayer insulating film between the floating and the control gate comprises two or more insulating films whose relative dielectric constants are different from one another. In this example, the interlayer insulating film comprises an oxide film, a nitride film, and an oxide film.

An elements separating insulation film 32 is formed on a semiconductor substrate 31 and the substrate is then thermal-oxidized to form a gates insulating film 33 of the high voltage type which has a desired film thickness (FIG. 4A).

The memory cell region is bored only at the tunnel window portion thereof, using the photolithographic technique, until the substrate 31 is exposed. After a tunnel insulating film 34 is formed by thermal oxidization, a first conductive film 35 is formed by LPCVD. After thermal treatment, an oxide film, a nitride film, and an oxide film are successively formed by thermal oxidizing or CVD method to form an interlayer insulating film 36. Those portions of the interlayer insulating film 36 including the above-mentioned three layers, of the first conductive film 35, and of the gates insulating film 33 of the high voltage type which extend over the 5V region are successively etching-removed, using the photolithographic technique again, and that top area of the substrate 31 which corresponds to the element active portion at the 5V region is exposed (FIG. 4B).

A gates insulating film 37 of the 5V type is then formed by thermal oxidization to a desired film thickness, and a second conductive film 38 is formed and thermal-treated (FIG. 4C).

When the gates insulating film is made thinner at the 5V region than at the high voltage region as described above, drain current can be increased and operation speed can be enhanced in the operation time of the logic transistor which is made operative by the common power source voltage of 5V and which is a component for forming the memory cell peripheral and large-scale logic circuits. In addition, short channel effect caused when these circuits are smaller-sized can be suppressed and the circuits can be thus integrated to a greater extent.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

I claim:

1. A semiconductor device comprising
   a first MOS transistor having a first gate insulating film, said first gate insulating film having a first film thickness;
   a second MOS transistor having a second gate insulating film, said second gate insulating film comprising a first portion whose film thickness is the same as said first film thickness, and a second portion having a second film thickness which is less than said first film thickness; and
   a third MOS transistor having a third gate insulating film, said third gate insulating film having a film thickness which is less than said first film thickness and greater than said second film thickness; wherein
   said first through third MOS transistors are on the same substrate and electrically connected together, and said first MOS transistor is made operative by a first gate voltage and said third MOs transistor is made operative by a second gate voltage which is less than said first gate voltage.

2. The semiconductor device according to claim 1, wherein said semiconductor device is of the non-volatile type enabling information to be electrically erased and programmed, said second MOS transistor is of the memory type having an electrically floating gate arranged on said second gate insulating film, said first MOS transistor is of the selection type for the memory transistor, and said third MOS transistor is of the logic type which is a component for forming a large-scale logic circuit.

3. The semiconductor device according to claim 1, wherein when said second film thickness is denoted by A, said third film thickness by B, and said first film thickness by C, A : B : C $= 1\times(1\pm0.25) : 2.1\times(1\pm0.25) : 4.2\times(1\pm0.25)$.

4. The semiconductor device according to claim 2, wherein when said second film thickness is denoted by A, said third film thickness by B, and said first film thickness by C, A : B : C$=1\times(1\pm0.25) : 2.1\times(1\pm0.25) : 4.2 (1\pm0.25)$.

* * * * *